United States Patent [19]

Miller et al.

[11] 4,190,799
[45] Feb. 26, 1980

[54] NONCONTACTING MEASUREMENT OF HALL EFFECT IN A WAFER

[75] Inventors: Gabriel L. Miller, Westfield; David A. H. Robinson, Summit, both of N.J.

[73] Assignee: Bell Telephone Laboratories, Incorporated, Murray Hill, N.J.

[21] Appl. No.: 935,518

[22] Filed: Aug. 21, 1978

[51] Int. Cl.² ............................................ G01R 33/00
[52] U.S. Cl. .............................. 324/239; 324/158 D; 324/233; 324/228
[58] Field of Search .......... 324/71 SN, 71 SE, 158 D, 324/158 R, 200, 226, 228, 233, 234, 236, 239, 251

[56] References Cited

PUBLICATIONS

Nyberg et al., "Electrodeless Techniques for Semiconductor Measurements", Canadian Journal of Physics, vol. 40, (1962), pp. 1174–1181.

*Primary Examiner*—Rudolph V. Rolinec
*Assistant Examiner*—Walter Snow
*Attorney, Agent, or Firm*—Allen N. Friedman

[57] ABSTRACT

The magnitude and sign of the Hall angle of the material of a wafer (13) are measured by a combined capacitive and inductive coupling technique which does not require physically contacting the wafer (13). Contacting methods in common use introduce surface damage or contamination which may reduce the yield of microelectronic circuits on semiconductor wafers and normally in addition require special sample geometries. In this technique an rf signal is applied to a pair of concentric planar electrodes (11,12) adjacent to the wafer (13), thus capacitively coupling a radial rf current into the wafer. A magnetic field applied perpendicular to the wafer produces a circular component of rf current because of the Hall effect. This circular rf current produces an axial rf magnetic field which couples to a pickup coil (15). The pickup signal is amplified and detected to produce an output signal related to the sign and magnitude of the Hall angle of the wafer material.

13 Claims, 11 Drawing Figures

NONCONTACTING MEASUREMENT OF HALL EFFECT IN A WAFER

TECHNICAL FIELD

The invention is in the field of the measurement of the electrical properties of solid materials intended for electronic usage. For example, the measurement of semiconductor wafers at various stages of discrete device or integrated circuit manufacture is contemplated.

BACKGROUND OF THE INVENTION

The measurement of the Hall angle of semiconductor material is an important aspect of its electrical characterization. The sign of the Hall angle indicates whether material is p-type or n-type while the magnitude of the Hall angle is proportional to the majority carrier mobility. However, prior Hall effect measurement requires some sort of contacting arrangement and/or special sample geometry and are therefore damaging or at least contaminating in nature. Thus, a noncontacting measurement of Hall angle is desirable.

A noncontacting method for the measurement of Hall mobility in semiconductor materials is described by Nyberg et al. in the *Canadian Journal of Physics* 40, (1962) November 1974. In this method a circular electrical current is inductively coupled into a spherical or cylindrical sample of semiconductor material. An imposed d-c magnetic field then produces a rotation of the plane of the inductively coupled current which is detected as a signal related to the Hall mobility. However, Nyberg described this technique as being sensitive to the precise relative position of the pickup coil and the sample, and, as disclosed, it is not applicable to the technologically important wafer sample geometry.

SUMMARY OF THE INVENTION

A novel noncontacting technique for the measurement of the Hall angle has been developed, as has a corresponding measurement apparatus. This represents an advance over widely used techniques involving the making of electrical contact to the semiconductor material because of the avoidance of surface damage or contamination produced at the contacts and the absence of the requirement of special sample geometry. This method is particularly adapted for the measurement of semiconductor wafers widely used in semiconductor device manufacture. In this method a pair of circular concentric coplanar electrodes is placed adjacent to the wafer. An alternating voltage applied to the electrodes produces, by means of capacitive coupling, an alternating radial current in the adjacent portion of the wafer. The application of a perpendicular magnetic field then produces a circular component of the capacitively coupled current. This circular current produces an alternating magnetic field parallel to the imposed magnetic field. This alternating magnetic field is inductively coupled to a pickup coil, the resulting signal being related to the Hall angle of the semiconductor material. If the imposed magnetic field is varied at a rate slow compared to the alternating radial current, a modulation of the Hall signal in the pickup coil is produced. Phase sensitive detection of the modulated pickup signal then yields the magnitude and sign of the Hall angle of the semiconductor material. This information is useful in semiconductor device manufacture to characterize the semiconductor wafer as to conductive type and carrier mobility.

DETAILED DESCRIPTION

Figure 1:
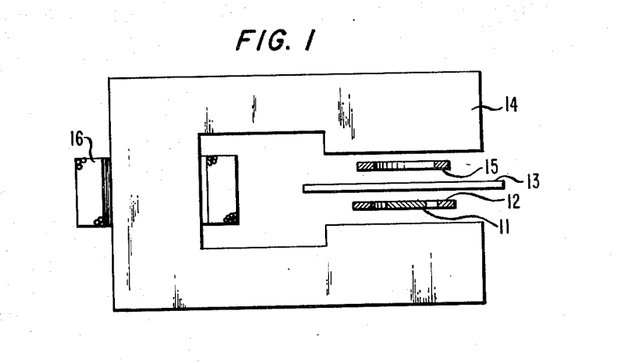
FIG. 1 is an elevational view in section of a portion of an exemplary apparatus of the invention.

The mechanical parts of a measurement apparatus for the noncontacting measurement of Hall angle are shown schematically in FIG. 1. In this figure a pair of planar concentric electrodes consisting of an inner electrode 11 and outer electrode 12 are placed adjacent to a semiconductor wafer 13 whose properties are to be measured. A magnetic field perpendicular to the plane of the wafer 13 is produced by an electromagnet 14 which is energized by field coil 16. The signal which ultimately results in the Hall measurement is obtained from the pickup coil 15 which is also situated in the magnet gap adjacent to the semiconductor wafer 13. The plane of the pickup coil 15 should be approximately parallel to the plane of the wafer 13 for optimum pickup of the Hall signal.

Figure 2:
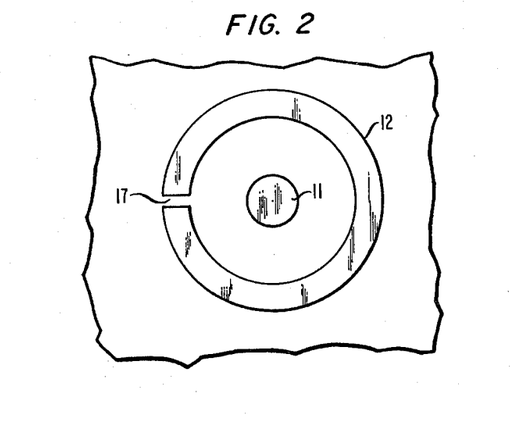
FIG. 2 is a plan view of an exemplary concentric electrode structure.

An exemplary electrode configuration is shown in FIG. 2. Here the inner electrode 11 is a disc and the outer electrode 12 is a ring. If variation of the magnetic field of magnet 14 is contemplated (e.g., for purposes of synchronous demodulation) any ring-shaped electrode, such as electrode 12, should include at least one gap 17 to minimize inductively produced circulating currents.

Figure 3:
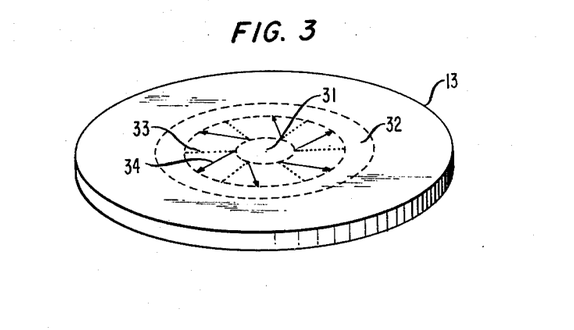
FIG. 3 is a perspective view of a semiconductor wafer with arrows representing the current flow pattern with (solid lines) and without (dotted lines) the application of a magnetic field.

The basic principle of operation of this method and apparatus can be understood from consideration of FIG. 3. This figure shows the semiconductor wafer 13 with the area 31 adjacent to the inner electrode 11 and the area 32 adjacent to the outer electrode 12 indicated by the concentric dashed circles. When a high frequency alternating voltage is imposed upon the electrodes 11, 12, an alternating current at the same frequency is capacitively coupled into the adjacent wafer 13. This current flows radially between the capacitively coupled areas 31, 32 of the wafer 13. This current flow pattern is indicated by the dotted lines 33.

If a magnetic field is imposed generally perpendicular to the wafer 13, the current flow pattern is rotated by magnetic forces as indicated by the solid arrows 34. This rotation of the current flow pattern by the presence of the magnetic field is what is generally known as the Hall effect, the magnitude of this rotation being proportional both to the magnitude of the magnetic field to the mobility of the electrical carriers (i.e., electrons or holes) producing the current flow. It is the measurement of this rotation (i.e., the Hall angle) which is the object of this method and apparatus. This rotated current flow pattern can be decomposed into a radial component and a circular component. This circular component of current, alternating at the same high frequency imposed upon the electrodes 11, 12, produces a high frequency alternating magnetic field perpendicular to the plane of the wafer 13. This alternating magnetic field is inductively coupled to the pickup coil 15 producing the desired signal related to the magnitude of the Hall angle of the material of the wafer 13. The phase of this pickup signal, relative to the phase of the signal imposed upon the electrodes 11, 12, will differ by 180 degrees depending upon whether the semiconductor wafer 13 is n-type or p-type. It is the object of the electronic circuitry to be described below to measure the magnitude and phase of the Hall signal.

In practice the choice of the particular high frequency to be used (to be referred to hereinafter as the rf frequency) presents conflicting requirements. On one hand it needs to be high enough to permit the capacitive coupling of sufficient electric current into the semiconductor wafer 13, while on the other hand it must be low enough to avoid skin effect problems in low resistivity semiconductor samples. A preferred range is from $10^5$ Hz to $10^6$ Hz. The rf frequency selected for the construction of an exemplary apparatus was approximately 600 kHz. This frequency was selected for use with semiconductors ranging in sheet resistance from of the order of $10^{-3}$ to $10^5$ ohms per square.

While the principle of this measurement can be simply understood, the practitioner must consider a number of physical effects which operate to make the measurement difficult. The first of these is the direct coupling of rf signal between the drive electrodes 11, 12 and the pickup coil 15. This direct transmission of signals will be referred to below as crosstalk. There is one property of this crosstalk signal, used in the exemplary apparatus, which can be employed to differentiate the crosstalk signal from the Hall signal. This property is the fact that the crosstalk signal is independent of the magnetic field produced by the magnet 14. In the exemplary apparatus the magnetic field was varied at the frequency low compared to the rf frequency, by varying the current in the magnet drive coil 16. This results in a Hall signal which is modulated at the magnet frequency. The Hall signal was picked out of the much larger crosstalk signal by synchronous demodulation at the magnet frequency. In order to produce sufficient signal separation the magnet frequency should be at least a factor of $10^2$ lower than the rf frequency. A preferred range is from $10^2$ Hz to $10^3$ Hz. In the exemplary apparatus the magnet frequency was chosen to be approximately 300 Hz. This frequency will be referred to below as either the magnet frequency or the audio frequency.

Figure 4:
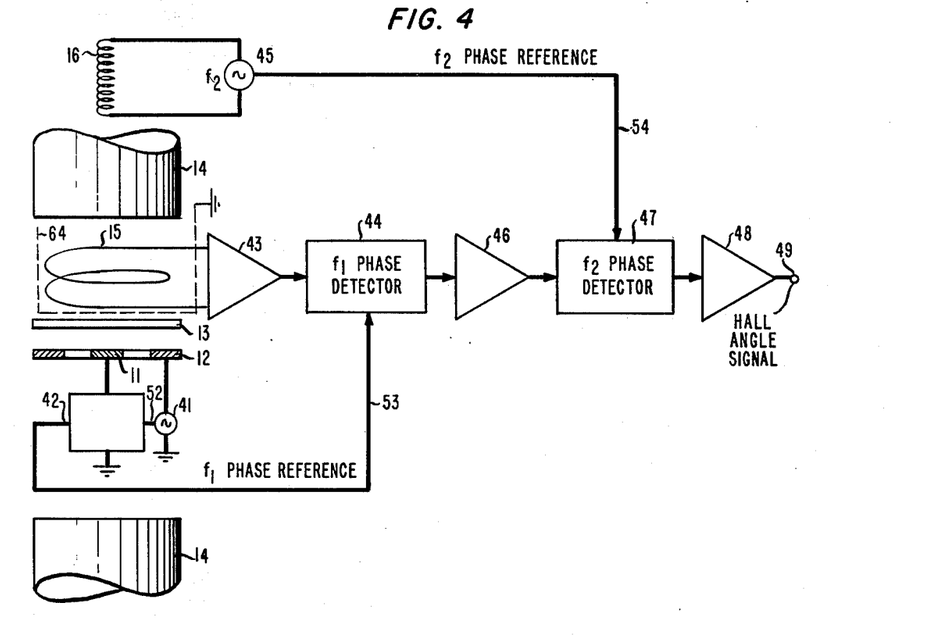
FIG. 4 is a schematic view, in simplified form of an exemplary apparatus of the invention.

The basic elements of a measurement system which can be used to measure the Hall angle by the method outlined above are schematically shown in FIG. 4. The concentric electrodes 11, 12 are driven at the rf frequency, $f_1$, by oscillator 41. The amplitude of the drive is monitored by the level sensing circuit 42. The level sensing circuit 42 provides a level control signal 52 to the oscillator 41 and also a rf phase reference signal through lead 53. The indicated arrangement in which the outer electrode 12 is driven by the oscillator 41 and the current level is monitored from the inner electrode 11 is preferred since the dependence of the test result upon the diameter of the semiconductor wafer 13 is reduced.

The electromagnet 14 is energized by the magnet drive coil 16. This coil 16 is driven by the magnet oscillator 45 at the magnet frequency, $f_2$. The oscillator 45 also provides a phase reference signal at the magnet frequency at lead 54.

The pickup coil 15 is electrostatically shielded by means of a resistive shield 64 (a carbon coating in an exemplary apparatus) and is connected to the input amplifier 43. The amplified signal is synchronously demodulated in the phase sensitive detector 44 using the rf phase reference signal from lead 53. The demodulated signal, now at the magnet frequency, $f_2$, is simplified by means of amplifier 46. The amplified signal is synchronously demodulated in the magnet frequency phase detector 47 using the magnet frequency phase reference signal from lead 54. The demodulated d.c. signal is again amplified by amplifier 48 and produces the output signal at terminal 49 whose sign and magnitude are related to the conductivity type and mobility of the material of the semiconductor wafer 13.

Figure 5:
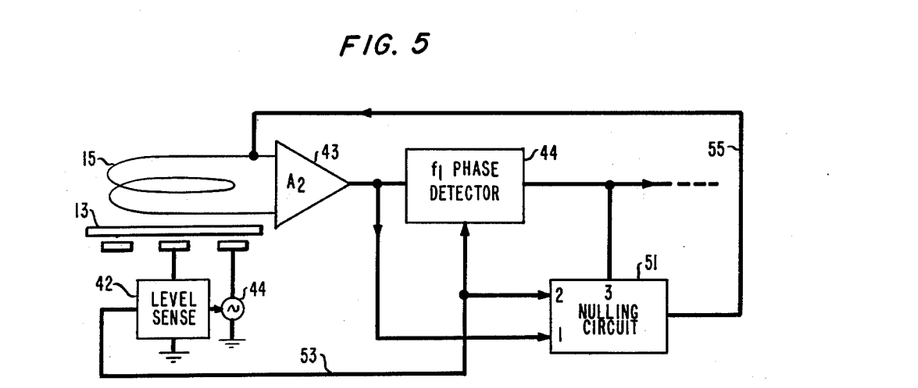
FIG. 5 is a schematic view of a portion of an exemplary apparatus of the invention showing drive current control and cancellation of spurious pickup.
Figure 8:
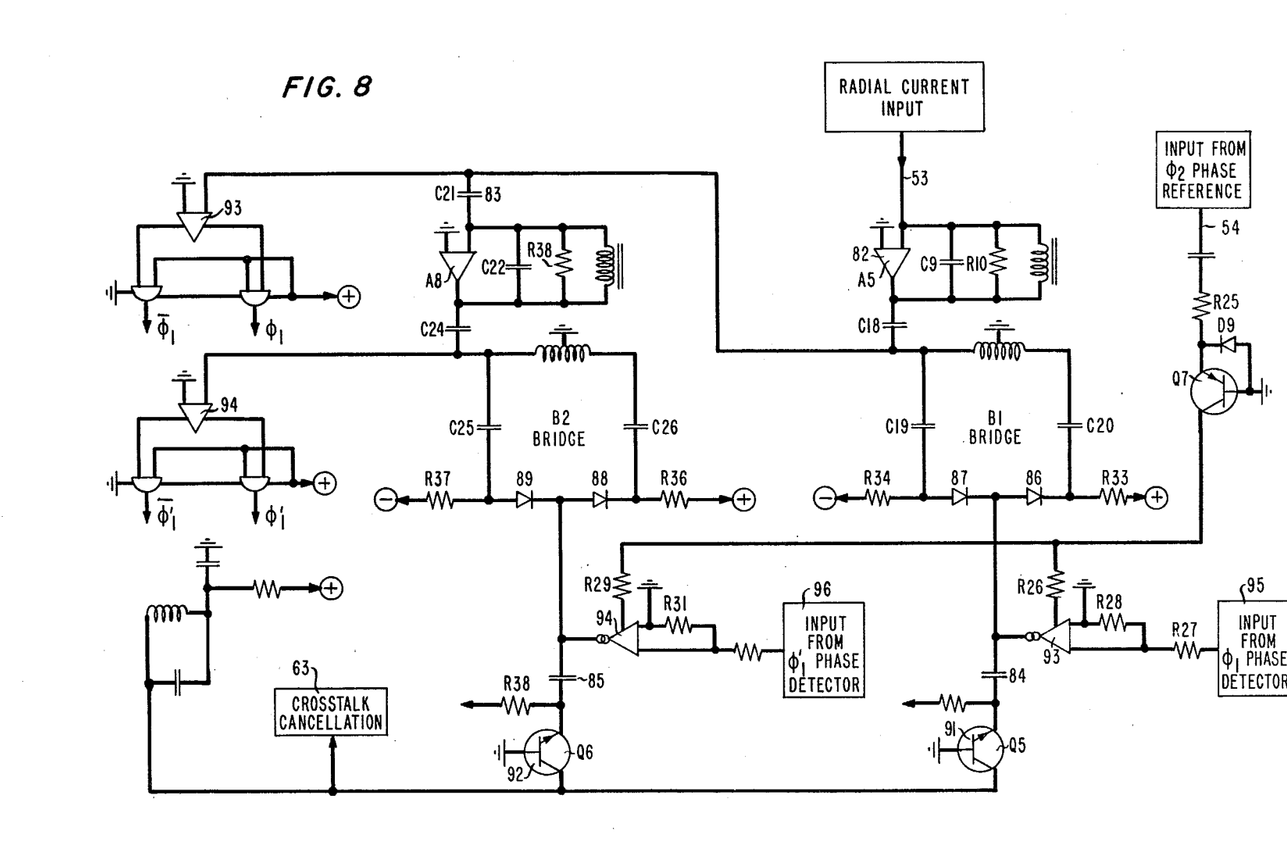
FIG. 8 is a schematic view of a portion of circuitry including portions of the pickup cancellation circuit.

If the pickup signal produced by the direct leakage between the drive electrodes 11, 12 and the pickup coil 15 is large enough to drive amplifier 43 out of its linear range of operation the Hall signal, modulated at the magnet frequency, will be degraded. FIG. 5 indicates schematically the reduction of the crosstalk signal through the use of a crosstalk nulling circuit 51 to introduce a crosstalk cancelling signal at the rf frequency into the input of amplifier 43 by means of lead 55. In an exemplary apparatus two such feedback loops were utilized. One of these operated from the output of phase detector 44 while the other operated from the output of a second phase detector whose reference phase was at 90 degrees to the phase of the first phase detector 44 (phase quadrature). Each detector output phase drives a separate varactor diode through a long time constant filter. The varactors each form part of a two capacitor bridge, driven from the amplifier 43 output. Overall action of this feedback system is then to null out the average crosstalk to the input amplifier 43 no matter what the drive level of current generator 41. The time constant of this feedback system should be at least ten times the time constant corresponding to the magnet frequency. In this case it was approximately one second. Thus the Hall signal (modulated at the magnet frequency of approximately 300 Hz) was not effected while the unmodulated pickup crosstalk signal was cancelled assuring that the rf amplifiers operate within their linear range. The exemplary nulling circuit is shown in FIG. 8 in which the two varactor bridges 80, 81 are driven in phase quadrature from the drive circuitry via lead 53, the 90 degrees relative phase shift being provided by capacitor 83. The operation of this circuit will be explained more fully below.

In an exemplary constructed system, Hall data was obtained to an accuracy of approximately plus or minus 10 cm$^2$/volt second over a range of sheet resistance from approximately $10^{-2}$ to $10^5$ ohms per square following calibration at a single point. The accuracy was limited by the noise level which was approximately 10 cm$^2$/volt-sec. This performance was achieved when operating with a one second overall averaging time, a radial current of approximately 100 microamps and a sampling area of approximately one square cm. The magnetic field alternates over a peak-to-peak range of approximately one kG while the rf and audio frequencies were 600 kHz and 300 Hz, respectively.

Figure 6:
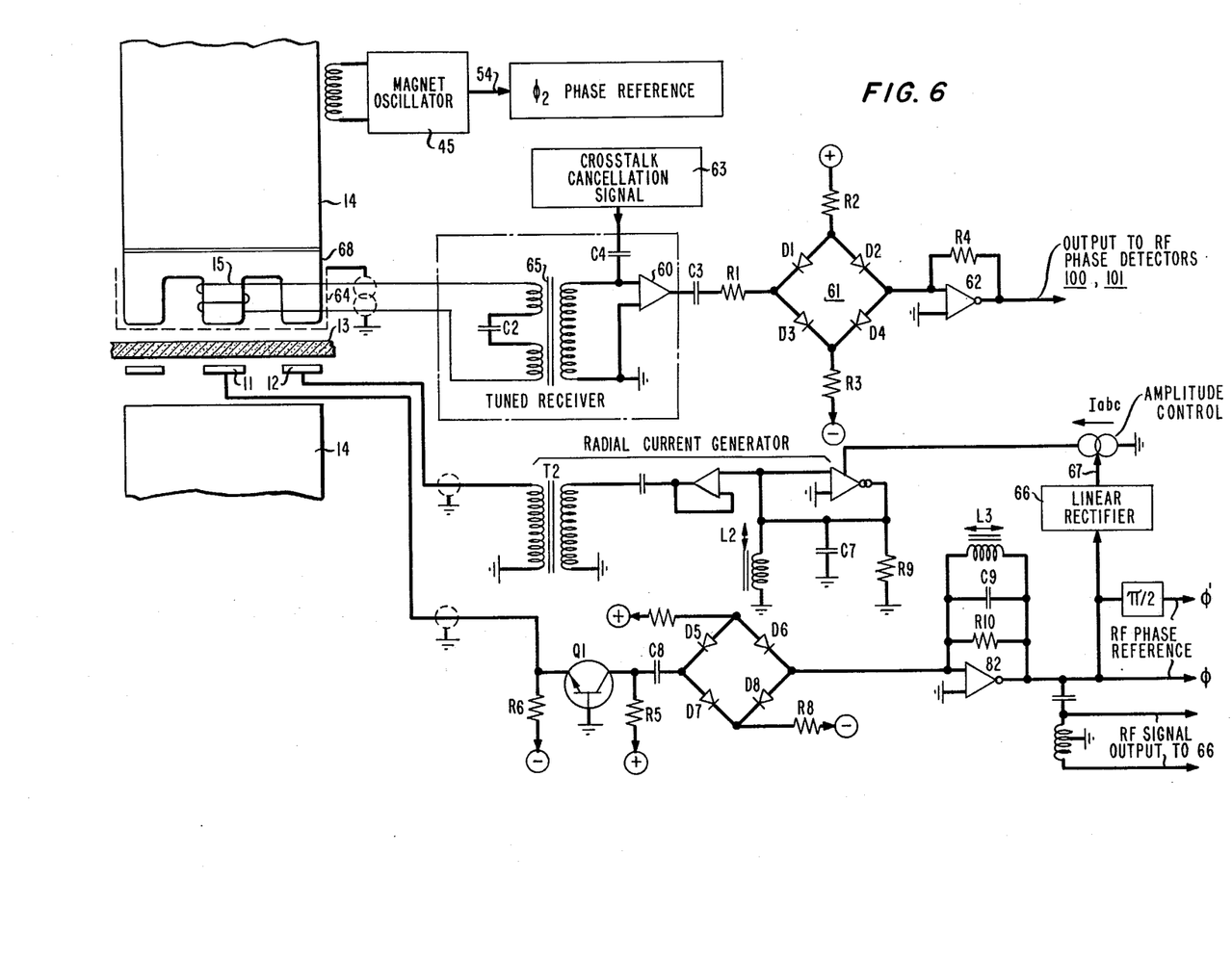
FIG. 6 is a schematic view of a portion of the inventive circuitry including details of the drive current control and signal input circuitry.
Figure 7:
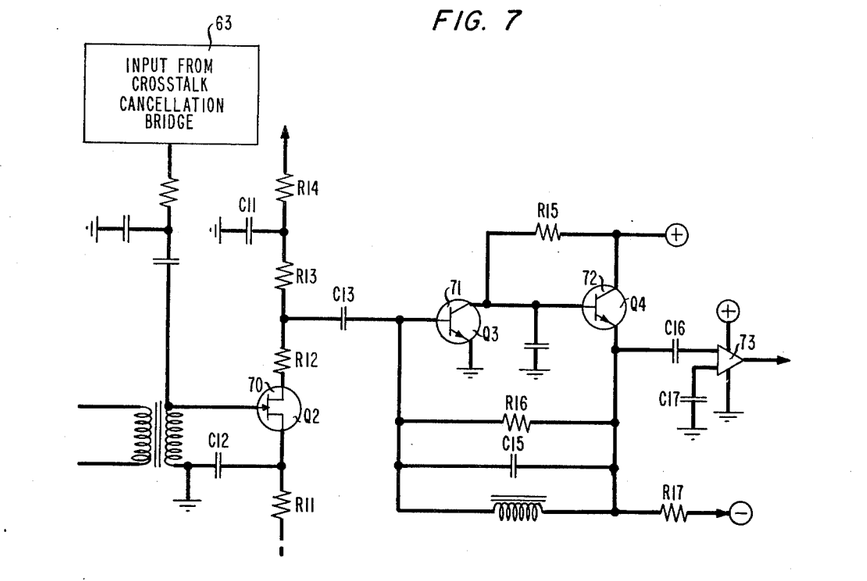
FIG. 7 is a schematic view of an exemplary signal input circuitry.

In the initially constructed embodiment of the apparatus of the invention some dependence of the measurements results upon the thickness and diameter of the semiconductor wafer 13 was observed. For many users these effects produce no difficulty since wafers of the same size and thickness are repeatedly measured and a single calibration will still lead to consistent results over a wide range of carrier mobilities. These geometric effects are reduced by methods involving confining the electrical and magnetic couplings close to the gap between the magnet pole pieces 14. The previously mentioned expedient of driving the outer electrode 12 and monitoring current flowing into the inner electrode 11 is one such expedient. Another is the use of a cup core 68 such as illustrated in FIG. 6. The material of the cup core should be selected so as to maintain high permeability at the rf frequency so that the magnetic field coupled to the pickup coil 15 is confined to the region of magnetic pole pieces 14. The use of ferrite or powder iron cup cores is indicated for most uses. In an exemplary construction it proved to be advantageous to round the corners of the cup core 68 to eliminate the possible saturation of the material at sharp corners. In an apparatus which utilizes phase sensitive detection at the magnet frequency, it is particularly important that the material of the magnet 14 and cup core 68 are magnetically soft and of appropriate dimension to be nonsaturating up to the magnetic field to be used for the Hall measurement.

A somewhat more detailed view of exemplary circuitry for the performance of the above described Hall measurement is presented in FIGS. 6 through 10. The basic desire is to perform the measurement of a relatively small signal in the presence of large alternating voltages at the rf frequency. The steps taken include the provision of electrostatic shielding 64 around pickup coil, the use of an alternating magnetic field and provision for operating the entire system as a self-balancing bridge to cancel out the undesired crosstalk. In simplified form these provisions are shown in FIG. 4 and have been explained above.

In this apparatus a constant current rf generator 41 provides the required radial current, while the system operates as a double lock-in by synchronously demodulating the signal from the pickup coil 15 first at the rf frequency, $f_1$, and then at the magnet frequency, $f_2$. In addition, in a manner that will be described in detail subsequently, an rf signal is fed back into the input of the signal amplifier 43 from a self-balancing rf bridge (e.g. 51 of FIG. 5) in such a way as to reduce the crosstalk to negligible proportions.

Figure 9:
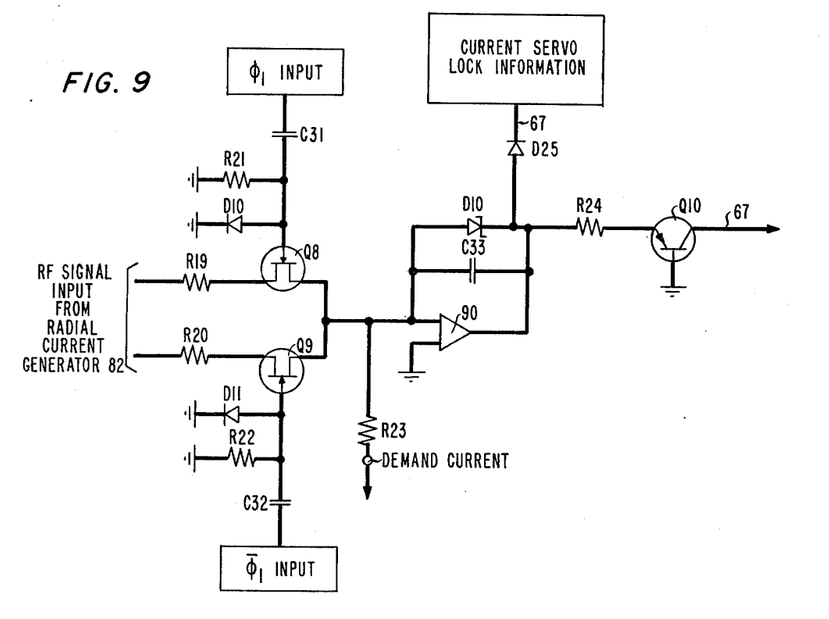
FIG. 9 is a schematic view of exemplary drive current control circuitry.

In pursuing such an approach three further effects should be considered; the pickup coil 15 produces a signal at the frequency $f_2$ (this can produce serious measurement errors due to cross-modulation effect in the signal amplifier 43), the signal amplifier 43 itself must preserve phase-coherence even under heavy overload conditions, and the rf current generator 41 must provide reliable phase information both under conditions of weak and extremely strong coupling to the semiconductor material. One method of treating these effects is shown in FIG. 6. Here the cross-modulation difficulty is handled through the use of a transformer 65 to couple to the amplifier 60 in the fashion indicated, and in addition using an FET (Field Effect Transistor) input in amplifier 60 (since both JFET's and MOSFET's, typically, exhibit smaller cross-modulation effects than do bipolar transistors). The phase-coherence under overload difficulty is handled by the use of a limiter 61, as indicated between amplifier 60 and 62, while the radial current generator includes a very high gain servo that provides a reliable radial current drive even under adverse conditions, (this driver is shown in FIGS. 6 and 9).

In addition it is necessary that the signal amplifier exhibit good signal to noise ratio performance. This in turn requires that at least the first two stages of the rf amplifier employed be appropriately designed. The exemplary low noise system used here is shown in detail in FIG. 7.

The current from the input JFET 70 drives the current amplifier formed by 71, 72, which in turn drives amplifier 73. This latter is selected to exhibit excellent phase coherence under heavy overload. The output of amplifier 73 drives the limiter 61 of FIG. 6, thereby ensuring that amplifier 62 is never overloaded.

CROSSTALK CANCELLATION

The crosstalk cancellation system employs two varactor bridges 80, 81 labelled B1 and B2 in FIG. 8. The B1 bridge is driven by amplifier 82, which in turn is actually measuring the radial current flowing in the semiconductor sample 13 (see FIG. 6). Provided the radial current servo is within range, (i.e., that the amplifier 90 output of FIG. 9 is below 10 volts when operating the system between positive and negative 12 volt power supplies) the radial current itself is constant and therefore so is the drive to the B1 bridge 80. The B2 bridge 81 is similar except that capacitor 83 produces a 90 degree phase shift in its drive with respect to the B1 bridge 80.

The balance of each bridge is controlled by the amount of charge stored on the capacitors 84 and 85. This in turn defines the voltage on the varactors 86, 87, 88 and 89, thereby controlling the total rf current drive to the transistors 91 and 92 emitters and, as a consequence, the magnitude of the crosstalk cancellation signal fed back to the rf amplifier input 63 (see FIG. 6 and FIG. 7).

Overall crosstalk cancellation is achieved by noting that the Hall signal itself should clearly be zero at the zero crossings of the magnetic field. Such a zero crossing sampling action is provided by gating on the operational transconductance amplifiers 93, 94 for a short time at alternate zero crossings of the low-frequency magnetic field. Since these amplifiers are driven, in effect, from a point corresponding to the output of amplifier 46 of FIG. 4, it is clear that the overall system moves to a zero crosstalk condition.

The use of only one sample per cycle of the low frequency magnetic field ensures, via the Nyquist sampling theorem, that the Hall signal itself (which is also at the same frequency) is not degraded in the crosstalk cancellation process.

THE PHASE SENSITIVE DETECTORS

Figure 10:
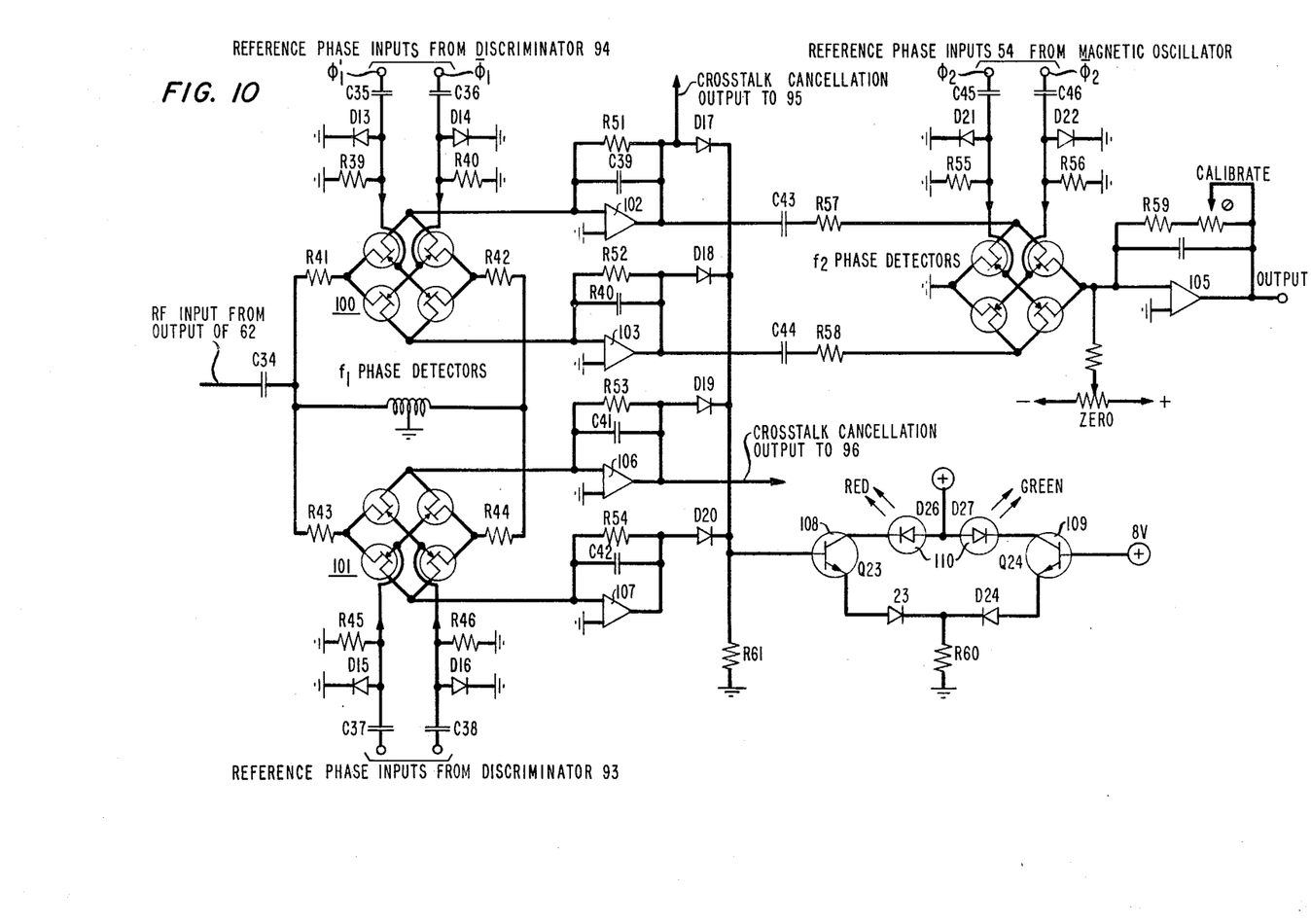
FIG. 10 is a schematic view of an exemplary circuitry including details of the rf and low frequency phase detectors.

Synchronous detection of the in phase and quadrature components of the rf signal is provided by the action of the JFET bridges 100 and 101 of FIG. 10. Here the reference phase information, is produced by the discriminators 93 and 94 of FIG. 8.

The complementary output of one bridge is then amplified by 102 and 103 before being synchronously demodulated at the magnet frequency, $f_2$, by the $f_2$ phase sensitive detector 104. This thereby provides the drive to the final output amplifier 105.

Overall servo-lock of the self-balancing bridge system is indicated by amplifiers 102, 103, 106 and 107 remaining within their dynamic range. This is monitored by the action of transistors 108 and 109 and an LED alarm 110.

GEOMETRICAL EFFECTS

The use of a simple air-core pickup coil of the type shown in FIG. 4 can lead to Hall measurements that are a function of sample size. This is because of the contribution of rf current flowing in the semiconductor sample at some distance from the disc 11 and ring 12 assembly. This can be alleviated, as shown in FIG. 6 by the two steps of confining the region of the $f_2$ magnetic field to the region of interest on the sample and simultaneously confining the pickup coil in a ferrite cup core.

Figure 11:
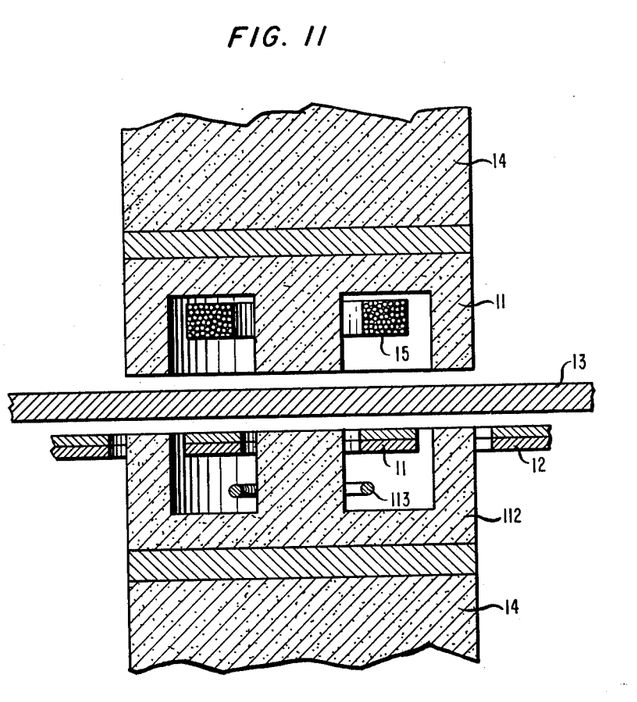
FIG. 11 shows details of an exemplary magnetic pole piece and electrode configuration.

It may be possible to further limit these effects through the use of a symmetrical structure with a cup core both above and below the semiconductor material as shown in FIG. 11. An alternate means of introducing the pickup cancellation signal would be by means of inductive coupling via a loop 113 below the wafer 13. It has been found expedient to round the edges of the ferrite cup core, somewhat as indicated in FIG. 6. This minimizes noise generated by the Barkhausen effect arising from high field region of the ferrite material saturating at the peaks of the applied field.

We claim:

1. A method for the measurement of the Hall angle of the material of a semiconductor wafer characterized by (a) capacitively coupling a radial rf current of a first frequency and of preselected magnitude into the wafer, in the plane of the wafer; (b) imposing, on the wafer, in the region of the rf current, a magnetic field approximately normal to the wafer, thus producing a circular current at the first frequency in the plane of the wafer, (c) inductively picking up a first frequency measurement signal produced by the circular current and (d) measuring the first frequency measurement signal as a measure of the magnitude of the circular current by a method including phase sensitive detecting, thus producing an output signal related to the magnitude and sign of the Hall angle of the wafer material.

2. A method for the measurement of the Hall angle of the material of a semiconductor wafer characterized by (a) capacitively coupling a radial rf current of a first frequency and of preselected magnitude into the wafer, in the plane of the wafer; (b) imposing, on the wafer, in the region of the rf current, a magnetic field approximately normal to the wafer and varying at a second frequency and at least $10^2$ times smaller than the first frequency, thus producing a circular current at the first frequency in the plane of the wafer, which circular current is modulated at the second frequency; (c) inductively picking up a first frequency measurement signal consisting of a modulated measurement signal portion produced by the circular current and an unmodulated measurement signal portion produced by spurious leakage and (d) measuring the modulated measurement signal portion as a measure of the magnitude of the circular current by a method including phase sensitive detection at the second frequency, thus producing an output signal related to the magnitude and sign of the Hall angle of the wafer material.

3. A method of claim 2 including varying the magnetic field through zero value, sensing the magnitude and phase of the first frequency measurement signal, generating a first frequency nulling signal with a modulation time constant at least ten times larger than the time constant corresponding to the second frequency and injecting the nulling signal into the first frequency input circuitry so as to null the unmodulated measurement signal portion.

4. A method of claim 2 in which the capacitive coupling is accomplished by placing the semiconductor wafer adjacent to, but electrically insulated from a pair of concentric electrodes.

5. A method of claim 4 in which a first frequency current is applied to the outer electrode from a constant current source and the first frequency current is monitored at the inner electrode to control the constant current source.

6. A method of claim 2 in which the magnitude of the magnetic field is of the order of $10^3$ gauss, the first frequency is from $10^5$ Hz to $10^6$ Hz and the second frequency is from 100 Hz to 1000 Hz.

7. Apparatus for the measurement of the Hall angle of the material of a semiconductor wafer (13) comprising (a) an electromagnet (14) with a magnetizing coil (16) for producing a magnetic field in a field gap and a magnet driver (45) for producing a magnet current in the magnetizing coil (16); (b) measurement current means for producing an electric current in the semiconductor wafer (13) located in the field gap; and (c) sensor means for measuring the Hall effect signal produced when the electric current is caused to flow in the semiconductor wafer (13) in the presence of the magnetic field characterized in that (1) the measurement current means includes a pair of planar circularly symmetric concentric electrodes (11, 12), consisting of an inner electrode (11) and an outer electrode, (12) fixed in the field gap and parallel to the plane of the gap, and an rf driver (41), connected to the concentric electrodes, for capacitively coupling the electric current of a first frequency into the semiconductor wafer (13), which current flows radially in the absence of the magnetic field, which rf driver (42) includes means for producing a first frequency phase reference signal (53) related to the phase of the electric current; and (2) the sensor means includes a pickup coil (15) fixed in the field gap approximately parallel to the plane of the field gap, for sensing the circular component of the electric current in the semiconductor wafer (13) produced by the Hall effect interaction between the radial electric current and the magnetic field, and amplifying-detecting means (43,44,46,47,48) coupled to the pickup coil (15), for producing an output signal related to the magnitude and sign of the Hall angle of the material of the semiconductor wafer (13).

8. Apparatus for the measurement of the Hall angle of the material of a semiconductor wafer (13) comprising (a) an electromagnet (14) with a magnetizing coil (16) for producing a magnetic field in a field gap and a magnet driver (45) for producing a magnet current in the magnetizing coil (16); (b) measurement current means for producing an electrical current in the semiconductor wafer (13) located in the field gap; and (c) sensor means for measuring the Hall effect signal produced when an electric current is caused to flow in the semiconductor wafer (13) in the presence of the magnetic field characterized in that (1) the measurement current means includes a pair of planar circularly symmetric concentric electrodes (11,12), consisting of an inner electrode (11) and an outer electrode (12), fixed in the field gap and parallel to the plane of the gap, and an rf driver (41), connected to the concentric electrodes, for capacitively coupling the electrical current of a first frequency into the semiconductor wafer (13), which current flows radially in the absence of the magnetic field, which rf driver includes means for producing a first frequency phase reference signal (53) related to the phase of the electric current; (2) the magnet driver (45) includes means for varying the magnet current at a second frequency and for producing a second frequency phase reference signal (54) related to the magnitude and phase of the magnetic field in the field gap and (3) the sensor means includes a pickup coil (15) fixed in the field gap approximately parallel to the plane of the field gap, for sensing the circular component of the electric current in the semiconductor wafer (13) produced by the Hall effect interaction between the radial electric current and the magnetic field, and amplifying-detecting means (43,44,46,47,48) coupled to the pickup coil (15), for producing an output signal related to the magnitude and sign of the Hall angle of the material of the semiconductor wafer (13).

9. A device of claim 8 in which the amplifying-detecting means includes a first amplifier (43) coupled to the pickup coil, which first amplifier (43) is adapted for maintaining an approximately linear relationship between the phase of the output signal and the phase of the input signal under input overload.

10. A device of claim 8 in which the rf driver (41) is connected to the concentric electrodes (11,12) so as to drive the outer electrode (12) and monitor the electric current at the inner electrode (11).

11. A device of claim 8 in which the amplifying-detecting means includes a first frequency phase sensitive detector (44) coupled to the first amplifier (43) and with means for accepting the first frequency reference signal (53), for producing a second frequency signal related to the Hall angle of the semiconductor material and a pickup signal related to spurious feed through signals which are not magnetic field dependent.

12. A device of claim 11 in which the amplifying-detecting means includes a second frequency phase sensitive detector (47) coupled to the first frequency detector (44) and including means for accepting the second frequency reference signal (54), for producing an output signal related to the Hall angle of the semiconductor material.

13. A device of claim 11 in which the amplifying-detecting means includes a nulling circuit (51) for sensing the pickup signal and introducing a nulling signal (55) into the input of the first amplifier (43) of such magnitude and phase as to null the pickup signal.

* * * * *